United States Patent
Larson et al.

(10) Patent No.: US 6,914,317 B2
(45) Date of Patent: Jul. 5, 2005

(54) THIN MICROELECTRONIC SUBSTRATES AND METHODS OF MANUFACTURE

(75) Inventors: Charles E. Larson, Nampa, ID (US); Timothy E. Murphy, Meridian, ID (US); Bryan L. Taylor, Boise, ID (US); Jon M. Long, Boise, ID (US); Mark W. Ellis, Meridian, ID (US); Vincent L. Riley, Emmett, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/646,608

(22) Filed: Aug. 21, 2003

(65) Prior Publication Data

US 2004/0038500 A1 Feb. 26, 2004

Related U.S. Application Data

(60) Continuation of application No. 09/846,057, filed on Apr. 30, 2001, now Pat. No. 6,693,342, which is a division of application No. 09/589,244, filed on Jun. 7, 2000, now Pat. No. 6,303,469.

(51) Int. Cl.$^7$ .............................................. H01L 29/00
(52) U.S. Cl. ...................................... 257/522; 257/524
(58) Field of Search ............................... 257/522, 524, 257/773, 774, 775

(56) References Cited

U.S. PATENT DOCUMENTS

| | | | |
|---|---|---|---|
| 5,107,328 A | 4/1992 | Kinsman |
| 5,138,434 A | 8/1992 | Wood et al. |
| 5,374,564 A | 12/1994 | Bruel |
| 5,494,835 A | 2/1996 | Bruel |
| 5,496,755 A | 3/1996 | Bayraktaroglu |
| 5,696,002 A | 12/1997 | Frank et al. |
| 5,773,352 A | 6/1998 | Hamajima |
| 5,938,956 A | 8/1999 | Hembree et al. |
| 5,946,584 A | 8/1999 | Ishikiriyama |
| 6,066,514 A | 5/2000 | King et al. |
| 6,089,920 A | 7/2000 | Farnworth et al. |
| 6,096,574 A | 8/2000 | Smith |
| 6,097,091 A | 8/2000 | Ohsumi |
| 6,110,825 A | 8/2000 | Mastromatteo et al. |
| 6,114,221 A | 9/2000 | Tonti et al. |
| 6,225,651 B1 | 5/2001 | Billon |
| 6,259,153 B1 | 7/2001 | Corisis |
| 6,294,837 B1 | 9/2001 | Akram et al. |
| 6,300,670 B1 | 10/2001 | Kramer et al. |
| 6,303,469 B1 | 10/2001 | Larson et al. |
| 6,319,751 B1 | 11/2001 | Lin |
| 6,693,342 B2 | 2/2004 | Larson et al. |

OTHER PUBLICATIONS

Wolf and Tauber; Silicon Processing for the VLSI Era vol. 1: Process Technology; p. 1; Lattice Press, 1986; Sunset Beach, CA.*

Wolf and Tauber, Silicon Processing for the VLSI Era, vol. 1: Process Technology pp. 27 and 30–31, 1986, Lattice Press, Sunset Beach, California.

\* cited by examiner

Primary Examiner—George Fourson
Assistant Examiner—Fernnado L. Toledo
(74) Attorney, Agent, or Firm—Perkins Coie LLP

(57) ABSTRACT

A microelectronic substrate and method for manufacture. In one embodiment, the microelectronic substrate includes a body having a first surface, a second surface facing a direction opposite from the first surface, and a plurality of voids in the body between the first and second surfaces. The voids can extend from the first surface to a separation region beneath the first surface. At least one operable microelectronic device is formed at and/or proximate to the first surface of the substrate material, and then a first stratum of the microelectronic substrate above the separation region is separated from a second stratum of the microelectronic substrate below the separation region. The first stratum of the microelectronic substrate can be further separated into discrete microelectronic dies before the first stratum is separated from the second stratum. In one aspect of this embodiment, the substrate can support a film and microelectronic devices can be formed in the film and/or in the substrate.

13 Claims, 3 Drawing Sheets

THIN MICROELECTRONIC SUBSTRATES AND METHODS OF MANUFACTURE

This application is a continuation of U.S. patent Application Ser. No. 09/846,057, filed Apr. 30, 2001, now U.S. Pat. No. 6,693,342, issued Feb. 17, 2004, which is a divisional of U.S. patent application Ser. No. 09/589,244, filed Jun. 7, 2000, now U.S. Pat. No. 6,303,469, issued Oct. 16, 2001.

TECHNICAL FIELD

This invention relates to thin microelectronic substrates and methods for manufacturing and processing such microelectronic substrates.

BACKGROUND OF THE INVENTION

Packaged microelectronic assemblies, such as memory chips and microprocessor chips, typically include a microelectronic substrate die encased in a plastic, ceramic or metal protective covering. The die includes functional devices, such as memory cells, processor circuits, and interconnecting circuitry. The die also typically includes bond pads electrically coupled to the functional devices. The bond pads are coupled to pins or other types of terminals that extend outside the protective covering for connecting to buses, circuits and/or other microelectronic assemblies.

Conventional microelectronic assemblies are typically mounted on a circuit board or other support device that is incorporated into a computer, mobile phone or other larger electronic product. One drawback with this arrangement is that the packaged microelectronic assemblies can extend a substantial distance away from the surface of the circuit board. Accordingly, it may be difficult to fit the circuit board and the attached microelectronic assemblies into the housing of a compact, low profile electronic product.

One approach to address this problem is to reduce the thickness of the packaged microelectronic assembly by reducing the thickness of the die within the package. For example, in one conventional arrangement, the functional features of the die are formed on or proximate to one surface of a substrate wafer. After forming these features, the opposite surface of the wafer is ground down ("backgrinding") by chemical-mechanical planarization ("CMP") or other techniques to reduce the overall thickness of the wafer. The wafer is then placed on an adhesive film and cut or singulated to form individual dies. The adhesive film is stretched to separate adjacent dies from each other and a suction cup removes the singulated dies from the adhesive film. The singulated dies are then encapsulated in the protective covering to form a packaged die having a reduced thickness.

One drawback with the backgrinding approach is that the amount of material that can be removed from the wafer by this process is limited because the wafer must remain sturdy enough to withstand the stresses applied to the wafer during the backgrinding process and other subsequent steps, such as transporting the wafer, mounting the wafer to the adhesive film and cutting the wafer. For example, the conventional techniques known by the inventors for reducing the thickness of the die typically cannot produce wafers less than about 150 microns thick without causing an unacceptable increase in the number of broken or damaged wafers and/or dies.

SUMMARY OF THE INVENTION

The present invention is directed toward microelectronic substrates and methods for processing microelectronic substrates. A method in accordance with one aspect of the invention includes providing a substrate having a first surface and a second surface facing a direction opposite from the first surface. The method further includes forming a plurality of voids in the first surface with each void extending to a separation region beneath the first surface. At least one operable microelectronic device is formed at and/or proximate to the first surface of the substrate. The method still further includes separating a first stratum of the microelectronic substrate above the separation region from a second stratum of the microelectronic substrate below the separation region.

In a further aspect of the invention, the method can further include at least partially filling the voids with a filler material to close an open end of the voids at the first surface of the substrate, constructing a film on the first surface of the substrate, and forming at least one microelectronic device in the film. The voids can be filled with tungsten and can have a tapered shape with a larger open area at the separation region than at the first surface of the substrate.

The invention is also directed toward a microelectronic die. In one embodiment, the die includes a substrate having a first external surface, a second external surface facing a direction opposite from the first external surface, and a plurality of operable microelectronic devices at and/or proximate to at least one of the external surfaces. A thickness of the substrate between the first and second external surfaces is less than about 150 microns. In another aspect of the invention, the second external surface has a plurality of voids extending from the second external surface toward an intermediate location between the first and second external surfaces.

The invention is also directed toward a process for forming microelectronic susbstrates and a product formed by the process. In one embodiment, the process includes providing a substrate material with a first surface and a second surface facing a direction opposite from the first surface, forming a plurality of voids in the first surface with each void extending to a separation region between the first and second surfaces, and forming at least one operable microelectronic device at or proximate to the first surface of the substrate. The method can further include separating a first portion of the microelectronic substrate above the separation region from a second portion of the microelectronic substrate below the separation region.

DETAILED DESCRIPTION

The present disclosure describes microelectronic substrates and methods for manufacturing such substrates. Many specific details of certain embodiments of the invention are set forth in the following description and in FIGS. 1–6 to provide a thorough understanding of these embodiments. One skilled in the art, however, will understand that the present invention may have additional embodiments, or that the invention may be practiced without several of the details described below.

Figure 1:
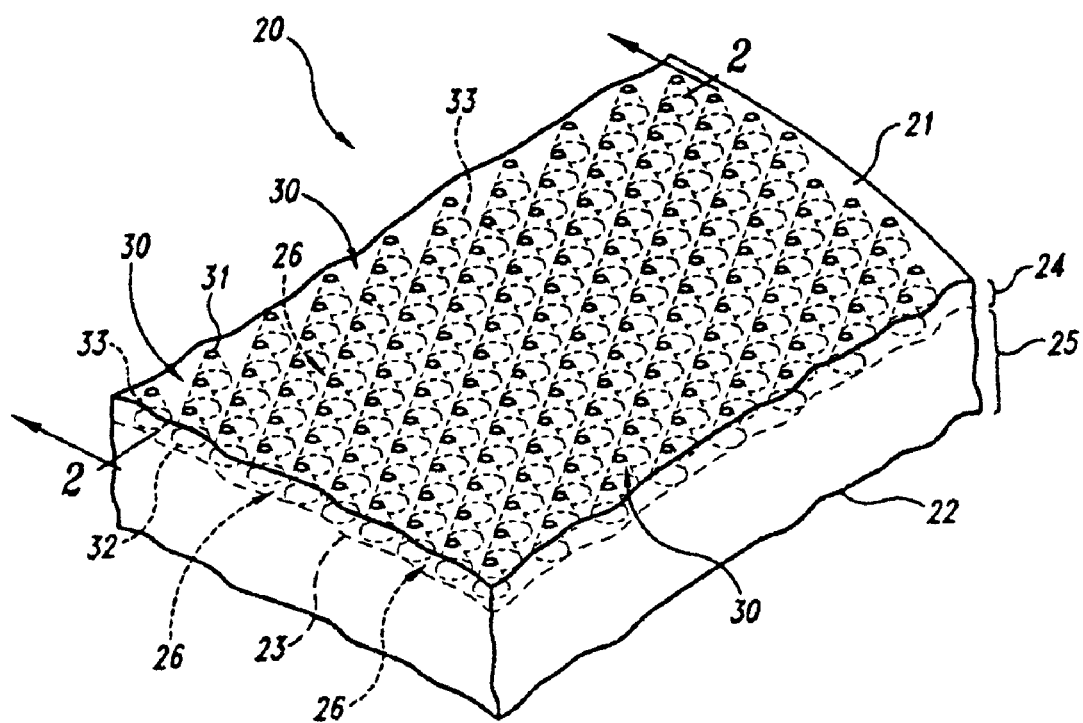
FIG. 1 is a top isometric view of a portion of a microelectronic substrate having voids in accordance with an embodiment of the invention.

FIG. 1 is a partially schematic, top isometric view of a portion of a microelectronic substrate 20 having a plurality of voids 30 in accordance with an embodiment of the invention. In one aspect of this invention, the microelectronic substrate 20 can include a circular wafer having an upper surface 21 and a lower surface 22 facing a direction opposite that of the upper surface 21. The voids 30 have an entrance opening 31 in the upper surface 21 and a blind end 32 beneath the upper surface 21. The blind ends 32 of the voids 30 define a perforated separation region 23 between the upper and lower surfaces 21 and 22. A relatively thin upper portion 24 or stratum of the microelectronic substrate 20 can be separated from a lower portion or stratum 25 at the separation region 23 to form thin microelectronic dies as described in greater detail below.

In one embodiment, the microelectronic substrate 20 can include a silicon wafer having a diameter of about eight inches. Alternatively, the microelectronic substrate 20 can have other diameters, for example, about twelve inches. In still further embodiments, the microelectronic substrate 20 can have other compositions, shapes, and/or dimensions. In any of these foregoing embodiments, the microelectronic substrate 20 is generally a brittle material that can separate at the separation region 23 for removing the upper portion 24 from the lower portion 25.

In one embodiment, the blind ends 32 of the voids 30 are all positioned at the same depth beneath the upper surface 21 of the microelectronic substrate 20 so that the separation region 23 can be an intermediate plane that is approximately flat and approximately parallel to the upper surface 21. Alternatively, the blind ends 32 of adjacent voids 30 can have different depths to define a curved or stepped separation region 23. In another aspect of this embodiment, the blind ends 32 of the voids 30 are larger than the entrance openings 31. Accordingly, the voids 30 have tapered sidewalls 33. In a further aspect of this embodiment, the tapered sidewalls can have a conical shape, or alternatively, the sidewalls 33 can have other tapered shapes. In still another alternate embodiment, the sidewalls 33 can extend normally to the upper surface 21 to have non-tapered (e.g., cylindrical) shapes.

The microelectronic substrate 20 also has connecting portions 26 between the voids 30 that connect the upper portion 24 of the microelectronic substrate 20 to the lower portion 25. When the sidewalls 33 of the voids 30 are tapered, the connection portions 26 are thinnest at the separation region 23. Accordingly, the microelectronic substrate 20 will be more likely to separate at the separation region 23 than at other locations when the microelectronic substrate 20 is subjected to an external force.

In one embodiment, the voids 30 are arranged in staggered rows with the voids 30 in one row offset transversely from the neighboring voids 30 in the adjacent rows. Alternatively, the voids 30 can be arranged in other patterns, for example, non-staggered rows, or the voids 30 can be randomly distributed over the first surface 21 of the microelectronic substrate 20. The voids 30 can be arranged with any combination of size and spacing that allows the upper portion 24 of the microelectronic substrate 20 to be separated from the lower portion 25 during a deliberate separating operation without weakening the separation region 23 such that the upper portion 24 separates prematurely during normal handling operations.

Figure 2:
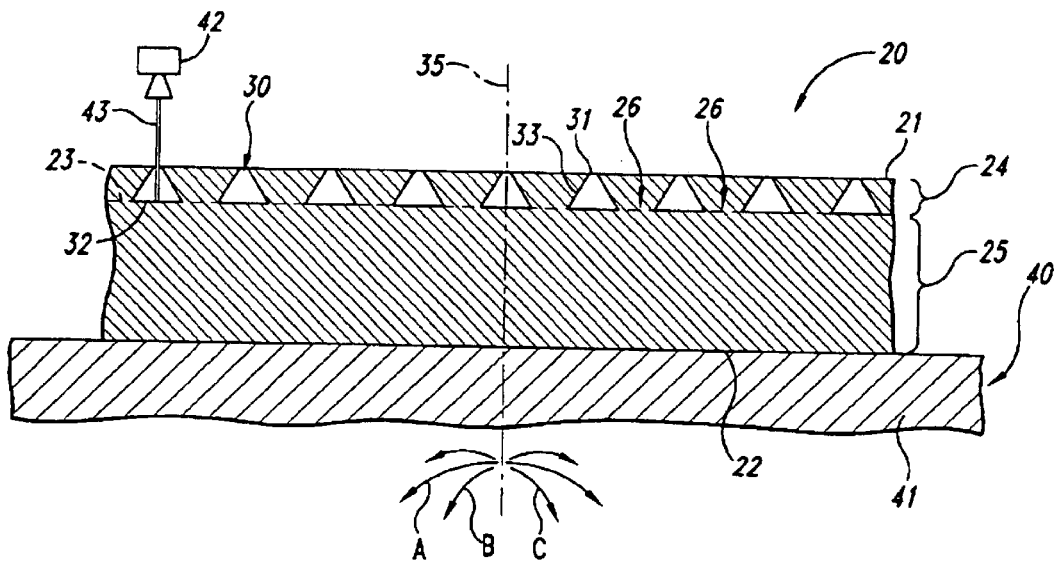
FIG. 2 is a partially schematic, cross-sectional view of the microelectronic substrate shown in FIG. 1 taken substantially along line 2—2, and a hole-forming apparatus in accordance with an embodiment of the invention.

FIG. 2 is a partially schematic cross-sectional view illustrating one stage of an embodiment of a method for manufacturing the microelectronic substrate 20 shown in FIG. 1. The microelectronic substrate 20 is supported on a hole-forming apparatus 40 in accordance with an embodiment of the invention. In one aspect of this embodiment, the apparatus 40 includes a support table 41 that supports the lower surface 22 of the microelectronic substrate 20. The apparatus 40 can further include a cutting tool 42 positioned above the support table 41 and the upper surface 21 of the microelectronic substrate 20. The cutting tool 42, for example, can direct an energy beam 43 toward the substrate 20 to form the voids 30. In one embodiment, the cutting tool 42 can be a laser that directs a laser beam toward the microelectronic substrate 20. Alternatively, the cutting tool 42 can generate an electron beam, a particle beam and/or other energy configured to selectively remove material from the microelectronic substrate 20 in a controlled manner. In other applications, the cutting tool 42 may even be a mechanical-type device that uses an abrasive or other type of cutting means to form the voids 30.

In one embodiment, the support table 41 can tilt and/or rotate about one or more axes to change the orientation of the microelectronic substrate 20 relative to the energy beam 43. In one aspect of this embodiment, the support table 41 can tilt to a selected angle and rock about a central axis 35, as indicated schematically by arrows A, B and C so that the energy beam 43 forms a conical voids 30. In other embodiments, the support table 41 can move in other manners to form voids 30 having entrance openings 31 that are smaller than the blind ends 32. In still further embodiments, the cutting tool 42 can move relative to the support table 41 in addition to or in lieu of moving the support table 41 to form the tapered voids 30. Alternatively, the support table 41 and the microelectronic substrate 20 can remain stationary relative to the energy beam 43 to form voids 30 having generally upright sidewalls 33 so long as the microelectronic substrate 20 preferentially separates at the separation region 23.

In still another embodiment, the hole-forming apparatus 40 can form the voids 30 using other techniques in lieu of or in addition to the techniques described above. For example, the apparatus 40 can selectively deposit an etchant on the upper surface 21 of the microelectronic substrate 20, with the etchant forming the voids 30 by removing material from the microelectronic substrate 20 in a direction transverse to the upper surface 21. In one aspect of this embodiment, a mask having openings corresponding to the locations of the voids 30 can be applied to the upper surface 21 of the microelectronic substrate 20 to protect the regions between the voids 30 from exposure to the etchant. The etchant can be removed from the microelectronic substrate 20 when the blind ends 32 of the voids 30 reach the separation region 23. The voids 30 can be formed with a tapered shape by tilting the support table 41 in a manner generally similar to that discussed above.

Figure 3:
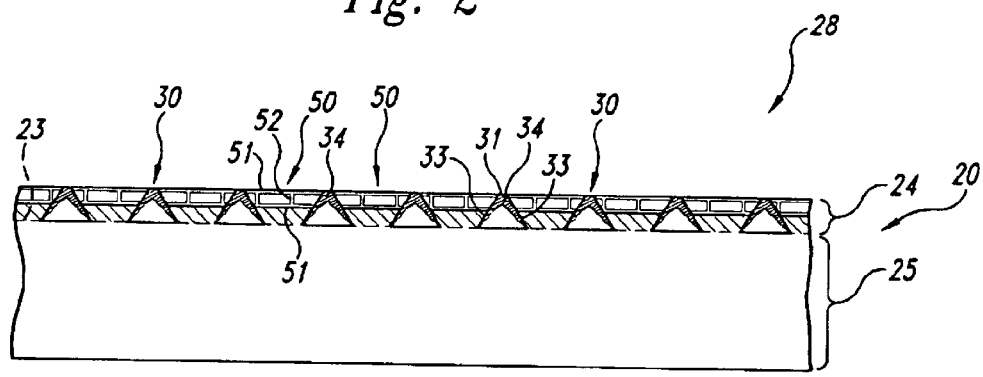
FIG. 3 is a partially schematic, cross-sectional view of the microelectronic substrate shown in FIG. 2 having the voids partially filled in accordance with an embodiment of the invention.

FIG. 3 is a partially schematic, cross-sectional view of the microelectronic substrate 20 shown in FIG. 2 with a plurality of operable microelectronic devices 50 incorporated therein to form a substrate assembly 28. In one aspect of this embodiment, each microelectronic device 50 can include two conductive planes 51 connected to each other with one or more conductive plugs 52. Alternatively, the devices 50 can include other conventional microelectronic features, such as memory devices or processor components. In a further aspect of this embodiment, each microelectronic device 50 can be contained within a region bounded by the immediately surrounding voids 30. Alternatively, the microelectronic devices 50 can extend to other portions of the microelectronic substrate 20 beyond the immediately surrounding voids 30. In either of these embodiments, the upper portion 24 of the microelectronic substrate 20 can then be separated into individual dies, and then the dies can be removed from the lower portion 25 as described below with reference to FIG. 5.

Alternatively, the upper portion 24 can be provided with additional features before it is separated. For example, in one embodiment, the voids 30 can be partially filled with a filler material 34. The filler material 34 can include tungsten or other suitable materials disposed in the voids 30 by conventional deposition techniques. In one aspect of this embodiment, the filler material 34 attaches to the sidewall 33 of each void 30 to close the entrance opening 31 without filling the entire void 30. The entrance opening 31 is more likely to close before the rest of the void 30 closes when the sidewall 33 is tapered. Closing the entrance openings 31 can strengthen the upper portion 24 of the microelectronic substrate 20 and can make the microelectronic substrate 20 more likely to separate at the separation region 23 than elsewhere. Furthermore, the closed entrance openings 31 can provide a more solid foundation for constructing subsequent layers on the upper portion 24 of the die 20 as described below with reference to FIG. 4. Conversely, an advantage of leaving the entrance openings 31 open, or at least partially open, is that the open voids 30 can vent gases from within the voids 30. Accordingly, the gases will be less likely to fracture the microelectronic substrate 20 if the microelectronic substrate 20 is heated during subsequent processing steps.

Figure 4:
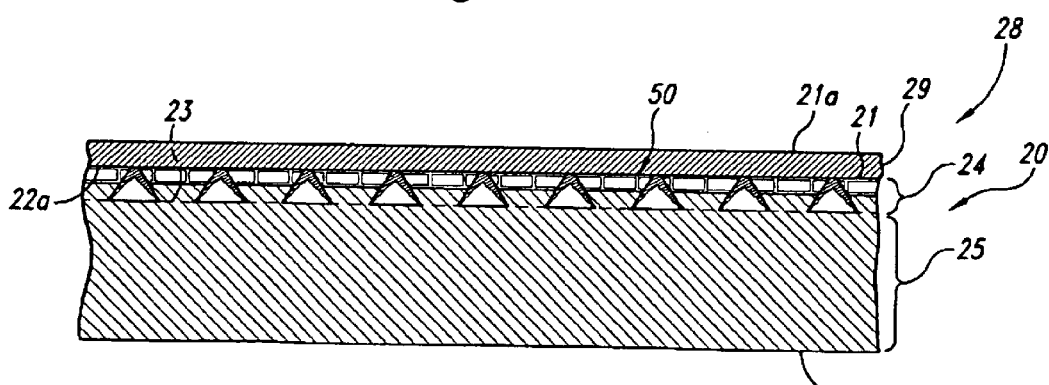
FIG. 4 is a partially schematic, cross-sectional view of the microelectronic substrate shown in FIG. 3 with a film disposed above the voids.

FIG. 4 is a partially schematic, cross-sectional view of a portion of the microelectronic substrate 20 discussed above with reference to FIGS. 1–3 supporting a film 29 in accordance with another embodiment of the invention. The film 29 has a lower surface 22a adjacent the upper surface 21 of the microelectronic substrate 20 and an upper surface 21a facing opposite the lower surface 22a. The film 29 can be formed by a process such as molecular beam epitaxy or a deposition process.

In one aspect of this embodiment, the film 29 can have a lattice structure that is aligned with a corresponding lattice structure of the microelectronic substrate 20. Alternatively, the film 29 can be coupled to the microelectronic substrate 20 without regard to lattice orientation. In either embodiment, the upper surface 21 of the microelectronic substrate 20 can be planarized (for example, by CMP) before the film 29 is applied to remove surface irregularities caused by the filler material 34. Both the microelectronic substrate 20 and the film 29 can be planarized at various stages to form microelectronic devices in the assembly 28.

Figure 5:
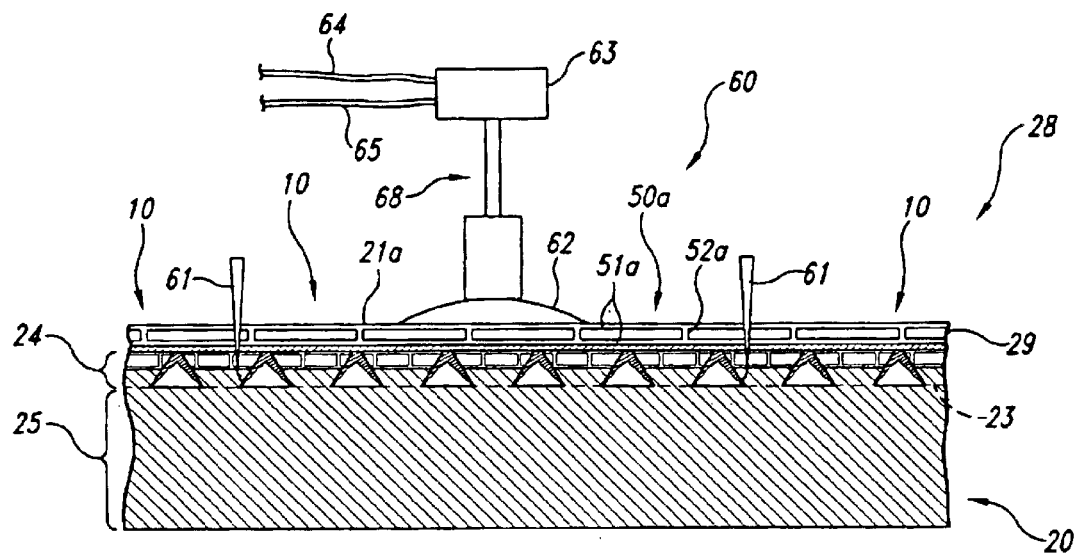
FIG. 5 is a partially schematic, cross-sectional view of the microelectronic substrate and film shown in FIG. 4 and a separation device in accordance with an embodiment of the invention.

FIG. 5 is a partially schematic, cross-sectional view of the substrate assembly 28 shown in FIG. 4, with operable microelectronic devices 50a formed in the film 29. In one aspect of this embodiment, the microelectronic devices 50a can include conductive planes 51a connected with conductive plugs 52a. In other embodiments, the microelectronic devices 50a can include other operable structures or elements.

The operable microelectronic devices 50a can be arranged to form individual dies 10 that are separated or singulated from each other with a separation device 60. In one aspect of this embodiment, the separation device 60 can include one or more cutting blades 61 that penetrate into at least the film 29. In another aspect of this embodiment, the cutting blades 61 can also penetrate into the microelectronic substrate 20 down to the separation region 23. Alternatively, the cutting blades 61 can penetrate into the assembly 28 by a distance sufficient to allow a fracture to progress from the lower end of the kerfs formed by the blades 61 to the separation region 23. When the film 29 is not present (FIG. 3) the cutting blades 61 penetrate into the microelectronic substrate 20 down to or proximate to the separation region 23 in a similar manner. In either of these embodiments, the cutting blades 61 can include rotary blades or other suitable devices.

In one embodiment, the separation device 60 includes a pick-up tool 68 for removing the dies 10 from the microelectronic substrate 20. In one aspect of this embodiment, the pick-up tool 68 includes a suction cup 62 that engages the upper surface 21a of the film 29. A vacuum line 64 is coupled between the suction cup 62 and a vacuum source (not shown) to evacuate the suction cup 62 and engage the pick-up tool 68 firmly with the film 29. The separation device 60 can further include an actuator 63 operatively coupled to the pick-up tool 68 to impart force and motion to the pick-up tool 68. For example, the actuator 63 can impart a downward motion to the pick-up tool 68 to separate the assembly 28 at the separation region 23. Alternatively, the actuator 63 can impart a motion transverse to the separation region 23 to split the assembly 28.

In one embodiment of the separation device 60, the motion and the force generated by the actuator 63 can be constant. Alternatively, the motion and/or the force can be variable. For example, in one embodiment, the actuator 63 can oscillate the suction cup 62 transversely at ultrasonic frequencies to separate the substrate assembly 28 along the separation region 23. In either embodiment, the magnitude, direction and frequency of the force and motion applied by the actuator 63 can be selected based, at least in part, on the spacing and shape of the voids 30 and on the material properties (such as the chemical composition and lattice structure) of the microelectronic substrate 20 and the film 29.

Figure 6:
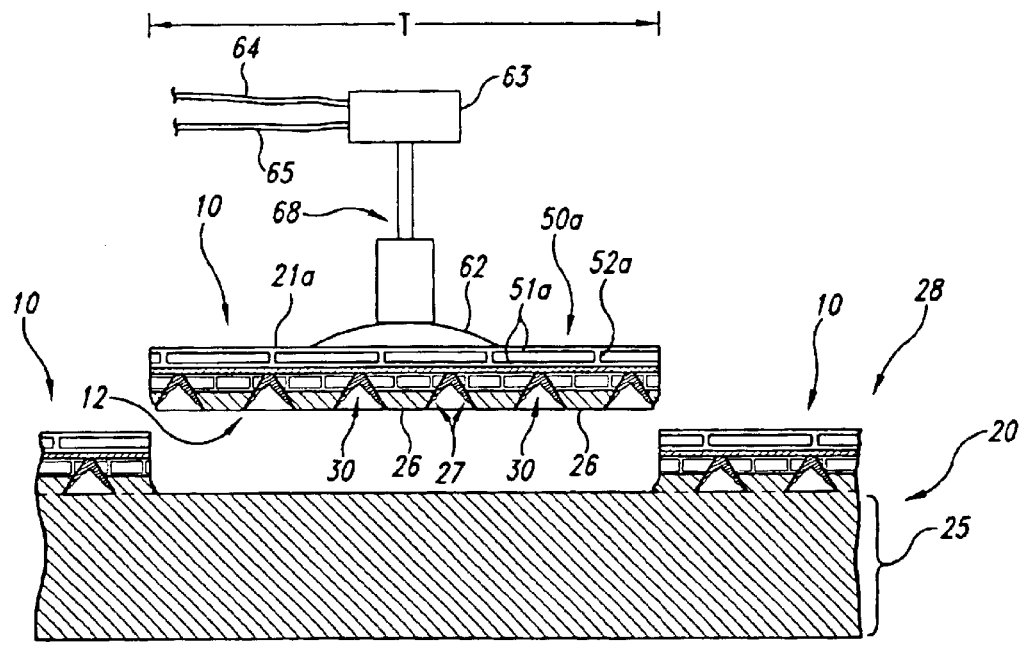
FIG. 6 is a partially schematic, side elevational view of a die removed from the microelectronic substrate shown in FIG. 5.

Once the substrate assembly 28 is split at the separation region 23, the pickup tool 68 lifts each die 10 clear of the lower portion 25 of the microelectronic substrate 20 (shown in FIG. 6). In one embodiment, the pick-up tool 68 can include a pressure line 65 coupled between the suction cup 62 and a source of compressed gas (not shown) to separate the die 10 from the suction cup 62 prior to packaging or mounting the die 10.

The die 10 can be attached directly to circuits or other devices, or alternatively, the die 10 can be packaged in a conventional manner to form a packaged microelectronic assembly suitable for coupling to circuits and/or other microelectronic assemblies. In one embodiment, an undersurface 12 of the die 10 can be attached to a support member (not shown) of the package with an epoxy or other adhesive. In one aspect of this embodiment, the undersurface 12 of the die 10 has protrusions 27 corresponding to the connecting portions 26. The protrusions 27 are separated by the open portions of the voids 30. An advantage of the protrusions 27 is that they can increase the surface area of the die 10 in contact with the adhesive to strengthen the bond between the die 10 and the support member. Alternatively, for example, when the undersurface 12 of the die 10 is exposed, the open portions of the voids 30 between the protrusions 26 can be filled with an epoxy or another filler.

In one aspect of the embodiments described above with reference to FIGS. 1–6, the size and spacing of the voids 30 can be controlled based on selected aspects of the processes described above. For example, when the substrate 20 and/or substrate assembly 28 are planarized after the voids 30 are formed, the voids 30 are sized and spaced to prevent separation at the separation region 23 during planarization, while allowing separation after the dies 10 have been singulated. In another aspect of these embodiments, the voids 30 are sized and spaced so that the blind ends 32 of adjacent voids 30 (FIG. 1) do not overlap, which would eliminate the connection portions 26 at the separation region 23. In still another aspect of this embodiment, the spacing between adjacent voids is less than a transverse dimension T (FIG. 6) of the die 10.

In an alternate embodiment, the blind ends 32 can overlap, but only along the lines delineating one die 10 from the next. Accordingly, the dies 10 can be easier to separate from each other. In a further aspect of this embodiment, the voids 30 on the delineating lines can merge with each other over the entire depth of the voids 30 (from the entrance opening 31 to the blind end 32) to eliminate the need for cutting the dies 10 apart with the blade 61.

In another embodiment, the lower portion 25 of the microelectronic substrate 20 can have a thickness (after the dies 10 have been removed) that is sufficient to allow the lower portion 25 to be re-used at least once to form additional dies 10. For example, the microelectronic assembly 28 can have an initial thickness of about 760 microns before the die 10 is removed. When the die 10 has a thickness of about 150 microns, the remaining lower portion 25 has a thickness of about 510 microns. This thickness may be sufficient to form additional dies 10, provided the machines used to handle and process the microelectronic substrate 20 and/or the substrate assembly 28 are configured to operate with substrates having such a thickness.

The thickness of a particular die 10 can depend, for example, on the size of the die 10, with longer and wider dies generally being thicker than shorter and narrower dies to provide the dies with suitable rigidity. The specific thickness of the die 10 can be controlled by controlling the depth of the voids 30 and, when the film 29 is present, the thickness of the film 29.

One feature of an embodiment of the methods and apparatuses described above with reference to FIGS. 1–6 is that the die 10 remains supported by the relatively thick lower portion 25 of the microelectronic substrate 20 even after the die 10 is separated or singulated from its neighboring dies 10. Accordingly, the die 10 is less likely to fracture during the singulation process. An advantage of this feature is that the die 10 can be made thinner than conventional dies. In one aspect of this embodiment, the die 10 can have a thickness less than about 150 microns, provided the die 10 is strong enough to undergo post-singulation processing steps without a substantial risk of breakage. Accordingly, the die 10 can be more compact than conventional dies and can occupy less space in the electronic products into which it is incorporated.

Another feature of an embodiment of the methods and apparatuses described above with reference to FIGS. 1–6 is that the cutting blades 61 do not penetrate through the entire substrate 20 or substrate assembly 28 when singulating adjacent dies 10. Accordingly, the cutting blades 61 will not wear as quickly as when used to cut conventional substrates.

In another embodiment, the cutting blades 61 can be eliminated by merging the voids 30 around the perimeter of each die 10, as described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A microelectronic die, comprising:

a substrate having a first portion with a first surface, a second portion with a second surface opposite the first surface, and a separation plane between the unseparated first and second portions, the first portion projecting from the second portion and having first and second voids extending from the first surface to the separation plane, the first void tapered along a first axis and the second void tapered along a second axis generally parallel to the first axis, the first and second tapered voids being larger toward the separation plane; and at least one operable microelectronic device disposed at least proximate to the first surface and between the first and second axes.

2. The microelectronic die of claim 1 wherein the at least one operable microelectronic device is disposed in the first portion of the substrate between the first and second tapered voids.

3. The microelectronic die of claim 1 wherein the first portion and the second portion have at least generally the same composition.

4. The microelectronic die of claim 1 wherein the first surface is separated from the separation plane by approximately 150 microns or less.

5. The microelectronic die of claim 1 wherein the first and second voids are etched voids.

6. The microelectronic die of claim 1 wherein the first portion further includes a third void extending from the first surface to the separation plane, and wherein the first, second, and third voids are regularly spaced apart from each other.

7. The microelectronic die of claim 1 wherein the first portion further includes a third void extending from the first surface to the separation plane, and wherein the first, second, and third voids are randomly spaced apart from each other.

8. The microelectronic die of claim 1 wherein the first and second voids each include a first end proximate to the first surface, and wherein the first ends are filled with a filler material.

9. The microelectronic die of claim 1 wherein the first and second portions of the substrate comprise silicon.

10. The microelectronic die of claim 1, further comprising a film layer disposed on the first surface.

11. The microelectronic die of claim 10 wherein the film layer has an external surface facing an opposite direction from the second surface of the second portion, and wherein a distance between the external surface and the separation plane is less than approximately 150 microns.

12. The microelectronic die of claim 1 wherein the first and second voids have a conical configuration.

13. The microelectronic die of claim 1 wherein the first void has a first depth and the second void has a second depth at least approximately equal to the first depth.

* * * * *